(12) United States Patent
Garg

(10) Patent No.: US 7,994,855 B2
(45) Date of Patent: Aug. 9, 2011

(54) AMPLIFIER ARRANGEMENT

(75) Inventor: Nitin Garg, Reading (GB)

(73) Assignee: Sequans Communications Limited, Reading (GB)

(*) Notice: Subject to any disclaimer, the term of this patent is extended or adjusted under 35 U.S.C. 154(b) by 97 days.

(21) Appl. No.: 12/338,702

(22) Filed: Dec. 18, 2008

(65) Prior Publication Data

US 2009/0160554 A1    Jun. 25, 2009

(30) Foreign Application Priority Data

Dec. 19, 2007  (EP) ..................................... 07254963

(51) Int. Cl.
*H03G 3/20* (2006.01)
(52) U.S. Cl. ..................... 330/136; 330/278; 330/124 R
(58) Field of Classification Search .................. 330/136, 330/278, 124 R
See application file for complete search history.

(56) References Cited

U.S. PATENT DOCUMENTS

| | | | |
|---|---|---|---|
| 5,768,694 A | 6/1998 | Kumagai | |
| 6,091,942 A | 7/2000 | Buer et al. | |
| 6,124,758 A * | 9/2000 | Korte et al. | 330/124 R |
| 6,226,504 B1 * | 5/2001 | Takagi | 455/234.1 |
| 6,320,913 B1 * | 11/2001 | Nakayama | 375/297 |
| 6,812,466 B2 * | 11/2004 | O'Connor et al. | 250/341.1 |
| 7,065,155 B2 | 6/2006 | Kaczynski | |
| 7,176,757 B2 * | 2/2007 | Nakatani | 330/107 |
| 7,352,239 B2 * | 4/2008 | Lee et al. | 330/124 R |
| 2008/0224769 A1 * | 9/2008 | Markowski et al. | 330/10 |

FOREIGN PATENT DOCUMENTS

| | | |
|---|---|---|
| EP | 0424009 | 4/1991 |
| EP | 0473299 | 3/1992 |
| EP | 0701332 | 3/1996 |
| EP | 1083668 | 3/2001 |
| GB | 2161335 | 1/1986 |
| WO | 0111769 | 2/2001 |

OTHER PUBLICATIONS

European Search Report to EP 07254963 dated May 8, 2008.

* cited by examiner

*Primary Examiner* — Patricia Nguyen
(74) *Attorney, Agent, or Firm* — Maier & Maier, PLLC

(57) ABSTRACT

A gain-controlled RF amplifier system has an input node and an output node. The system has a plurality of amplifier devices, selectively connectable between the input node and the output node. The amplifier devices are placed in circuit according to a measured gain derived by comparing a magnitude of a signal input to the input node against a magnitude of a signal output from the output node, and a desired value of gain.

13 Claims, 2 Drawing Sheets ature, 2007, the disclosure of which is incorporated by
AMPLIFIER ARRANGEMENT

RELATED APPLICATIONS

The present invention claims priority under 35 U.S.C. §119 to European Patent Application No. 07254963.7, filed on Dec. 19, 2007, the disclosure of which is incorporated by reference herein in its entirety.

FIELD OF THE INVENTION

The present invention relates generally to amplifiers, and more specifically but not exclusively to method of controlling the gain of an RF amplifier device and to a gain-controlled RF amplifier system.

BACKGROUND OF THE INVENTION

The gain control of an open-loop amplifier (small signal or large signal) is usually done by varying one or more of the gain parameters e.g. Gm (transconductance of the transistor), magnitude of source or load impedance etc, thus achieving a range of gain values.

Amplifier circuits realized using physical devices available in an integrated circuit process (e.g. transistors, resistors, capacitors etc) are subject to uncontrollable statistical variations in process, supply voltage and temperature (PVT). Therefore amplifier gain can drift from the desired gain value due to PVT variations. This problem may be alleviated in DC and low-frequency amplifiers by employing the technique of negative feedback; here open-loop gain of the amplifier is traded off to reduce the effects of PVT variations.

The application of similar techniques for gain control is usually not affordable in RF amplifiers because of scarcity of available gain at high frequencies within reasonable power consumption. RF amplifiers therefore tend to be operated in open-loop fashion that makes them susceptible to change in their performance (e.g. Gain) due to PVT variations.

Some prior art documents include U.S. Pat. No. 5,768,694 and U.S. Pat. No. 7,065,155.

U.S. Pat. No. 5,768,694 discloses an AGC circuit used in radio transmitters for satellite communications and the like intended to eliminate non-linearity compensators for detectors and reduce the radio transmitters in size and complexity. An RF input signal is amplified and output while passing through input splitting means, programmable attenuator, amplifier, and output splitting means. At the same time, a part of the RF input signal branches off at the input splitting means to input detecting means, where it is detected so as to obtain an input signal amplitude. In addition, a part of the amplifier output is split off at the output splitting means, then attenuated by attenuation means and finally reaches output detecting means, where the signal is detected so as to obtain an output signal amplitude after attenuation. Control means adjusts the attenuation factor of the programmable attenuator so that the input of the input detecting means will be equal to the input of the output detecting means.

U.S. Pat. No. 7,065,155 discloses a transceiver and a method of operating the same that includes in the transmitter a power control circuit that operates on an analog differential signal containing data packets individually. The power control circuit initially transmits a series of data symbols with known values, periodically strobes the transceiver system for correct power levels and incrementally increases the power level of the transceiver until the optimal gain is reached, without exceeding the maximum output power.

Other prior art documents include European publications EP 0473299 and EP 424009; GB published application 2161335, and U.S. Pat. No. 6,091,942.

SUMMARY OF THE INVENTION

It is an aim of embodiments of the present invention to allow for gain to be controlled accurately or stabilized over a range of values (both negative and positive) and eliminating variation due to PVT effects without sacrificing open-loop gain.

Embodiments achieve this aim in a power-efficient way.

In one aspect there is provided a method of controlling the gain of an RF amplifier device having an input signal and an output signal, the method comprising comparing a measure of magnitude of the input signal to a like measure of magnitude of the output signal; and using a result of the comparison to selectively enable amplifiers making up said amplifier device. The input signal may be at a first frequency, and the output signal at a second frequency different to the first frequency. The first frequency may be higher than the second. In another embodiment, the first frequency is lower than the second. In another family of embodiments, the first and second frequencies are the same as one another.

The method may further comprise using a result of the comparison to control a gain of at least one enabled amplifier.

The method may further comprise scaling at least one of the input signal and the output signal.

In the method the step of using the comparison result may comprise of applying the comparison result to a digital state machine to derive digital control signals for enabling respective amplifiers.

The digital state machine may be used with logic to derive the control signals; alternatively logic alone may be used.

In another aspect there is provided a gain-controlled RF amplifier system having an input node and an output node, comprising a plurality of amplifier devices, selectively connectable between the input node and the output node; means for comparing a magnitude of a signal input to the input node against a magnitude of a signal output from the output node; control means responsive to the comparison result to select between the plurality of amplifier devices.

In the gain-controlled RF amplifier system the control means may be responsive to the comparison result to vary the gain of at least one amplifier device In the gain-controlled RF amplifier system the amplifier devices may be generally in parallel.

At least one amplifier device may be in series with another amplifier device.

The gain-controlled RF amplifier system may have a digital state machine configured to receive the comparison result, thereby to provide digital control signals to control respective amplifier devices The digital state machine may be used with logic; alternatively logic alone may be used in some embodiments, At least one controllable scaling device may provide the or each input to a magnitude comparator.

At least one signal detector may be used in determining what signals are to be compared. Such a signal detector may be an envelope detector, a peak value circuit, RMS measuring circuit, averaging circuit or other detector, as appropriate.

In embodiments, gain control is exercised by switching ON or OFF discrete gain stages. These may be, for example, binary weighted or dB weighted gain stages, and may be connected in parallel. A digital control signal may be generated by successive approximation using a comparator that compares the 'equalized', detected input and output signals.

Embodiments allow gain control without change of biasing conditions of the gain stages. In these embodiments, gain is controlled by the number of individual gain stages switched ON at the time. Consequently, the gain control range is only limited by the number of individual gain stages connected in parallel.

The digital gain control technique is digital in operation and thus can be readily read, written to and stored for further computation by means of hardware or software control e.g. baseband chip in wireless communication transceiver.

Embodiments of the invention enable a technique of RF amplification whereby gain can be precisely controlled and/or made independent of process, supply voltage and temperature variations automatically.

BRIEF DESCRIPTION OF THE DRAWINGS

The invention will be more clearly understood by referring to the following description of embodiments, shown by way of example only. In the drawings.

DETAILED DESCRIPTION OF THE DRAWINGS

Figure 1:
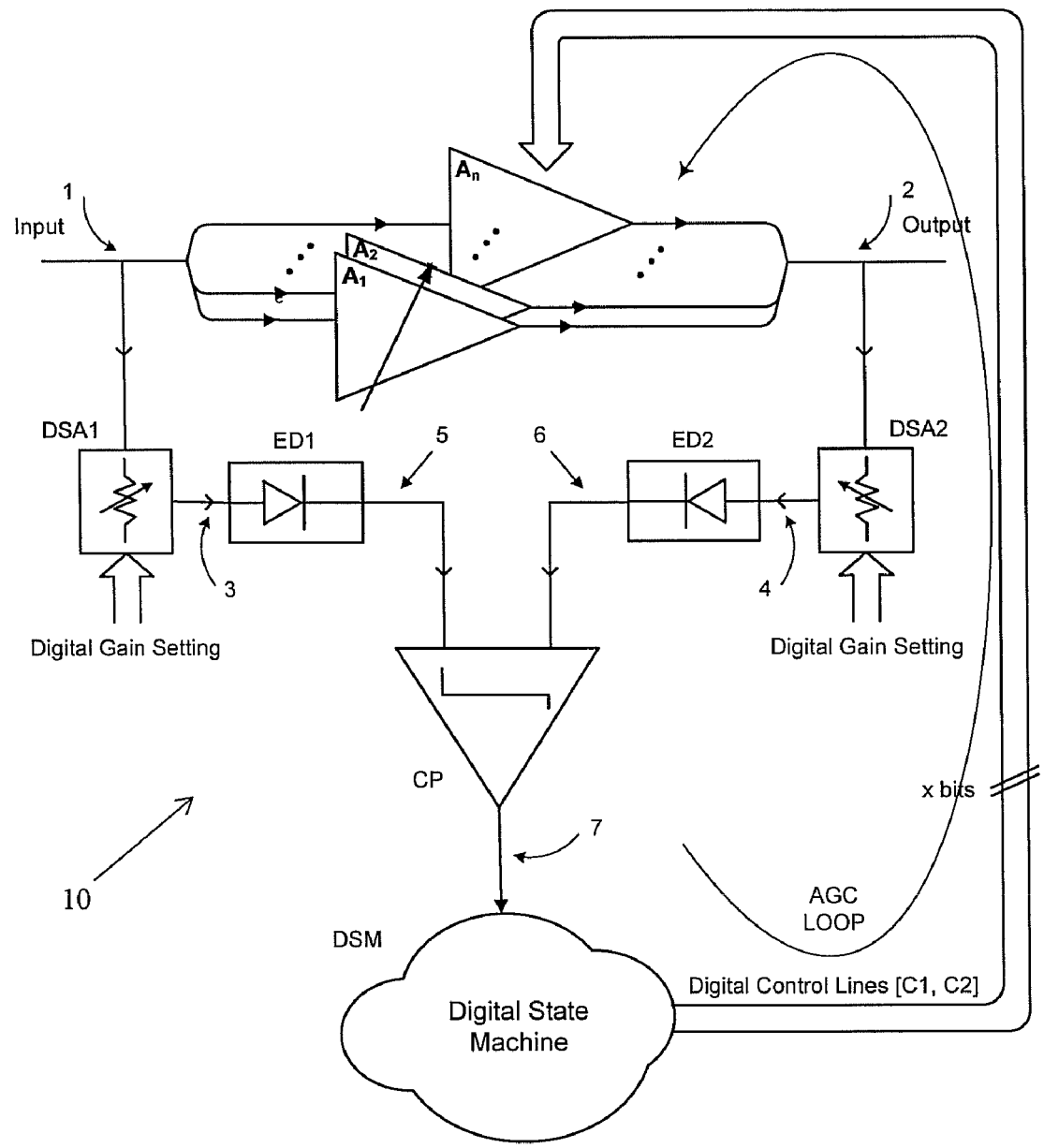
FIG. 1 shows a block diagram of an embodiment of a gain-controlled RF amplifier system.

Referring to FIG. 1, an amplifier system 10 consists of a plurality of individual RF gain stages $A_1$-An, also referred to herein as "amplifier devices", connected generally in parallel between an input node 1 and an output node 2. A first tapped attenuator DSA1 is connected between the input node 1 and a reference potential (not shown); the tap of the attenuator DSA1 is a first tap node 3. A second tapped attenuator DSA2 is connected between the output node 2 and a reference potential (not shown); the tap of the attenuator DSA2 is a second tap node 4.

In this embodiment, a first envelope detector ED1 is connected between the first tap node 3 and a first input node 5 of a comparator CP. A second envelope detector ED2 is connected between the second tap node 4 and a second input node 6 of the comparator CP. The comparator CP has an output node 7, which is connected to a digital state machine DSM. The digital state machine is connected to the respective gain stages $A_1$-An via plural control lines 11. A first set of control signals C1 is provided by the digital state machine to switch respective gain stages into and out of circuit.

Other embodiments use different detector devices, rather than envelope detectors. For example, peak detectors or RMS measuring devices or averaging circuits may be used, where appropriate to the desired effect.

The position of the tap point on each tapped attenuator, and hence the proportion of the respective input signal supplied to the respective tap point, of this embodiment is controllable by a digital gain control signal CS.

In this embodiment each gain stage is not only switchable by the first control signal C1, but also has a variable gain that is controlled by another digital control signal C2. G(i) is the gain of $i_{th}$ gain stage of the amplifier system and is defined as following function:

$$G(i)=f(g_{fixed}(i),C1(i),C2(i))$$

where
  $g_{fixed}(i)$ is the fixed gain of the $i_{th}$ stage
  $C1(i)$ is a digital control signal acting on the $i_{th}$ stage to switch the stage in or out of circuit $C2(i)$ is a digital control signal to vary the gain of the $i_{th}$ stage The overall gain of the amplifier system is digitally programmable over user-defined range by means of control signals C1 and C2.

The actual gain $G_a$ of the amplifier system is defined as the ratio of the RF signal at node 2 to that at node 1. Further it is equal to the summation of gain values of all N individual stages, each of which is dependent on the state of respective digital control signals [C1, C2].

$$G_a = \frac{S_2}{S_1} = \sum_{i=1}^{i=N} f(g_{fixed}(i), C1(i), C2(i))$$

The desired gain setting of the amplifier system is denoted as $G_d$ which is a set of user-defined values spanning a range from $G_{d,low}$ to $G_{d,high}$ with discrete unit step $\Delta_{Gd}$.

$$G_d = \{G_{d,low} \ldots G_{di} \ldots G_{d,high}\}$$

where $G_{di}$, the $i_{th}$ member of set $G_d$, is defined as $$G_{di} = G_{d,low} + i \cdot \Delta_{G_d}$$

The resolution of the amplifier gain discrete step is designed to be greater than the resolution of discrete unit step of the desired gain values.

Therefore, $$\min(G(i)) \leq \Delta_{G_d}$$

An automatic gain control scheme regulates the actual gain $G_a$ of the amplifier system, to keep it equal to the desired gain setting of the amplifier, $G_d$, in response to any intended change in $G_d$ such as setting a different gain value or unintended deviation, for instance due to process, supply voltage or temperature variations. The AGC scheme functions as follows:

Digital Step Attenuators DSA1 and DSA2 have high input impedance; therefore, their loading on the signal path circuitry of the amplifier is insignificant and does not affect the actual information in the signal. The function of DSA1 and DSA2 is to attenuate the sensed signal linearly in relation to the desired gain setting, $G_d$, of the amplifier system. The DSA attenuation value is based on the ratio of the values of passive devices available in an IC process (e.g. resistors or capacitors). The resistors or capacitors in a modern IC process can be manufactured to precise values and their PVT variations can be matched to a high degree of accuracy. Therefore, an attenuation value based on ratio of values of resistors or capacitors is highly accurate even in presence of PVT variations.

DSA1's set of discrete attenuation values $AT_1$ is equal to the subset of $G_d$ whose values are <1 in magnitude or equivalently <0 in dB terms. DSA2's set of discrete attenuation values $AT_2$ is equal to the subset of $G_d$ whose values are >1 in magnitude or equivalently >0 in dB terms.

$$AT_1 \subseteq G_d : |G_{di}| < 1, \text{ or, } dB(G_{di}) < 0$$

$$\subseteq 1 : |G_{di}| \geq 1, \text{ or, } dB(G_{di}) > 0$$

$$AT_2 \subseteq (G_d)^{-1} : |G_{di}| > 1, \text{ or, } dB(G_{di}) > 0$$

$$\subseteq 1 : |G_{di}| \leq 1, \text{ or, } dB(G_{di}) < 0$$

Further it is postulated that $$\frac{AT_1}{AT_2} = G_d$$

In one embodiment, DSAs are implemented as digitally programmable resistor ladder attenuators with discrete set of attenuation values as defined above. Other alternatives for example capacitors are possible.

If the desired gain $|G_d|$ is set as <1 or equivalently $dB(G_d)$ <0, then DSA1 attenuates the signal at node 1 by value of $AT_1$ and DSA2 provides no attenuation to the signal at node 2. Similarly, if the desired gain $|G_d|$ is set as >1 or equivalently $dB(G_d)$ >0, then DSA2 attenuates the signal at node 2 by value of $AT_2$ and DSA1 provides no attenuation to the signal at node 1. The outputs of DSA1 and DSA2 are available at nodes 3 and 4 respectively. The signals S3 and S4 at nodes 3 and 4 respectively can be written as:

$$S_3 = AT_1 \cdot S_1$$

$$S_4 = AT_2 \cdot S_2$$

Nodes 3 and 4 are coupled to the input of envelope detectors ED1 and ED2 respectively. ED1 and ED2 convert the RF signals S3 and S4 to equivalent quasi-dc signals S5 and S6 available at the output of envelope detectors at nodes 5 and 6 respectively.

Nodes 5 and 6 are coupled to the input of a comparator labeled CP. The comparator senses the difference in signals S5 and S6 and outputs a binary digital signal S7 at node 7 based on the polarity of the difference between signals S5 and S6. The digital signal S7 is coupled to a Digital State Machine labeled DSM which is implemented as a logic computation circuit. DSM computes a digital control signal [C1, C2] that is fed back to the amplifier to control its gain. The digital control signal [C1, C2] acts in opposite to the sense of difference in S3 and S4, thus giving a negative feedback signal to the amplifier. To illustrate the working of this negative feedback loop, consider $G_a$ to be greater than $G_d$. Therefore, S4(S6) would be greater than S3(S5). The comparator outputs a binary digital signal S7 to indicate this condition to DSM which in turn produces digital control signal [C1, C2] to reduce the gain of the amplifier. The negative feedback will continue to act till the following condition is enforced, $$S_3 = S_4$$

or, $$AT_1 \times S_1 = AT_2 \times S_2$$

or, $$\frac{AT_1}{AT_2} = \frac{S_2}{S_1}$$

which leads to $$G_d = G_a$$

Thus, the AGC Loop automatically controls the RF amplifier gain to equal to the digitally programmable desired gain setting and in the process eliminating effects of any PVT variations.

Embodiments may have the following advantages:
1) Enables RF amplification circuits to become more robust to inherent PVT variations in real world conditions.
2) Savings in silicon area and power consumption as these circuits need not be over-designed by large margins to counter PVT variations.
3) No need to calibrate the deviations in these circuits due to PVT effects.

In other embodiments, the gain stages are constant in gain, and are merely switched into and out of circuit to provide gain control. In some embodiments, at least one gain stage is not switchable and is always in circuit. In yet other embodiments, at least one gain stage is in series with another gain stage. In that case a "disabled" gain stage may have unity gain when in the disabled state.

Figure 2:
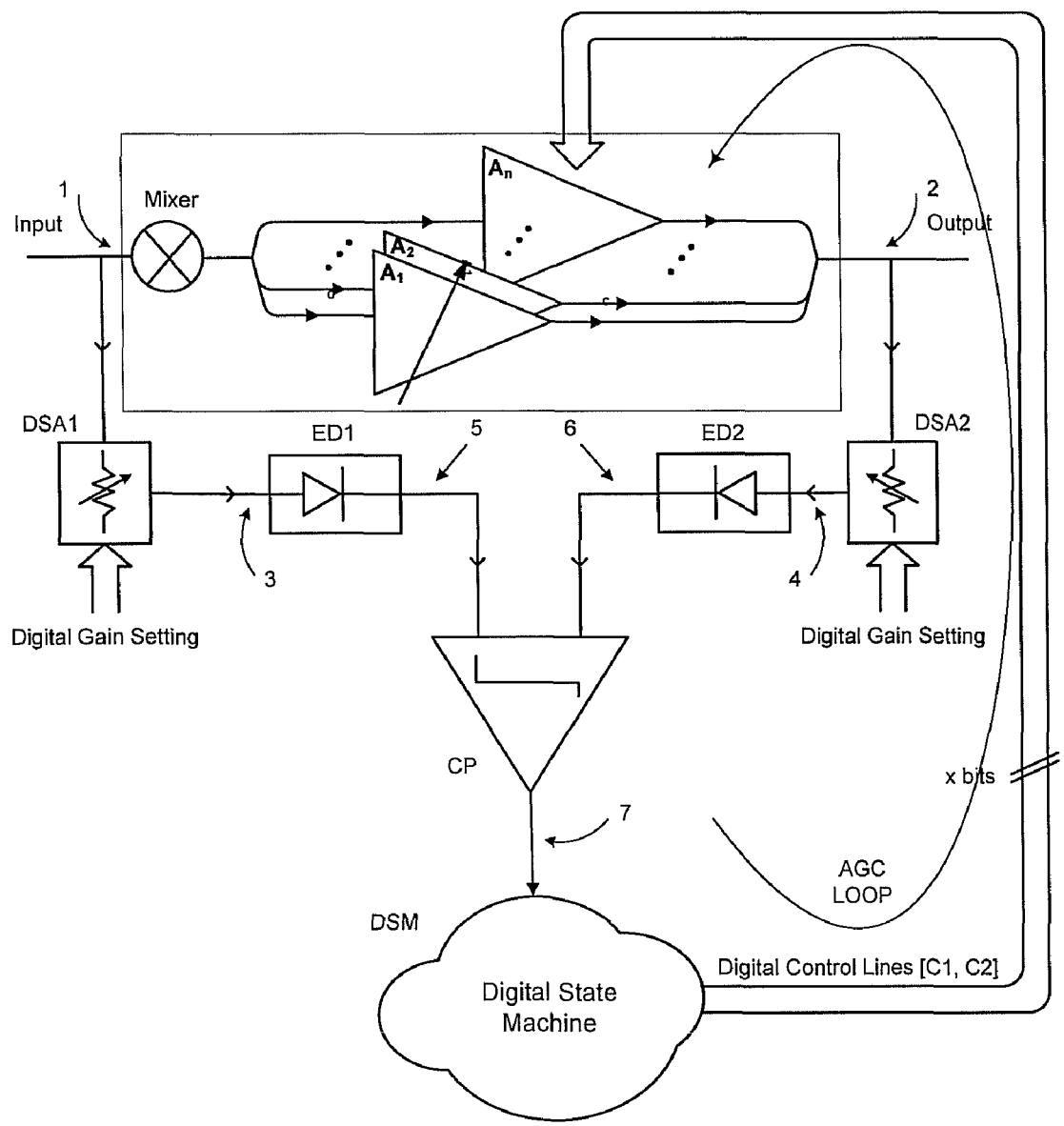
FIG. 2 shows a block diagram of an embodiment of a gain-controller down conversion system

Refer to FIG. 2, in another embodiment, there is a frequency down conversion block, herein referred to as 'Mixer' connected between node 1 and input of the amplifier or similarly between output of the amplifier and node 2. Thus the frequency f1 of input signal S1 may be different from the frequency f2 of output signal S2.

The mixer may alternatively be used for up-conversion in a further embodiment.

If an up converter then f2>f1 or if a down converter then f1>f2. The mixer may have a gain or loss value of its own.

This embodiment illustrates the gain control mechanism of the combined amplifier and mixer such that the combined gain is regulated to a user-specified gain setting and gain variations due to PVT effects are eliminated.

While the present invention has been described herein with reference to particular embodiments thereof, various changes and substitutions may be made in the foregoing disclosure without departing from the spirit and scope of the invention.

What is claimed is:

1. A method of controlling the gain of an RF amplifier device, the RF amplifier device having an input signal and an output signal, and a plurality of parallel-connected gain stages, the method comprising
   comparing a measure of magnitude of the input signal to a like measure of magnitude of the output signal; and
   using a result of the comparison to selectively enable said gain stages by switching respective gain stages into and out of circuit to achieve a gain equal to that of the sum of the gains of the enabled gain stages.

2. The method of claim 1, further comprising using a result of the comparison to control a gain of at least one enabled gain stage.

3. The method of claim 1, further comprising scaling at least one of the input signal and the output signal.

4. The method of claim 1, wherein said using step comprises applying a comparison result to a digital state machine to derive digital control signals for enabling respective gain stages.

5. A gain-controlled RF amplifier system, the system having an input node and an output node and further comprising
   a plurality of parallel-connected gain stages, connected between the input node and the output node;
   circuitry for comparing a magnitude of a signal input to the input node against a magnitude of a signal output from the output node, the comparing circuitry having an output providing a comparison result;
   a control means responsive to the comparison result to select a number of said parallel-connected gain stages.

6. The gain-controlled RF amplifier system of claim 5, wherein the control means is responsive to the comparison result to vary the gain of at least one gain stage.

7. The gain-controlled RF amplifier system of claim 5, wherein at least one gain stage is in series with another gain stage.

8. The gain-controlled RF amplifier system of claim 5, further comprising a digital state machine configured to receive the comparison result, thereby to provide digital control signals to control respective gain stages.

9. The gain-controlled RF amplifier system of claim 5, further comprising at least one controllable scaling device for providing the or each input to a magnitude comparator.

10. The gain-controlled RF amplifier system of claim 5, further comprising an impedance network, a detector device and a comparison circuit, the impedance network being connected between at least one of the input and output node and a reference, the impedance network having a tap, the detector device having an output, wherein the detector device is connected to the tap, and the output of the detector device is connected to the comparison circuit.

11. The gain-controlled RF amplifier system of claim 10, wherein the impedance network is passive.

12. The gain-controlled RF amplifier system of claim 10, wherein the detector device is one of the group comprising an envelope detector, a peak value circuit, an RMS detecting circuit and an average value circuit.

13. The gain-controlled RF amplifier system of claim 5, further comprising a frequency conversion device, whereby the circuitry for comparing is configured to compare a magnitude of a signal at a first frequency, input to the input node, against a magnitude of a signal at a second frequency, output from the output node.

* * * * *